United States Patent
Fu et al.

(10) Patent No.: US 11,860,256 B2
(45) Date of Patent: Jan. 2, 2024

(54) MRI STREAK-ARTIFACT SUPPRESSION, SYSTEM AND METHOD

(71) Applicant: Arizona Board of Regents on Behalf of the University of Arizona, Tucson, AZ (US)

(72) Inventors: Zhiyang Fu, Tucson, AZ (US); Maria I. Altbach, Tucson, AZ (US); Ali Bilgin, Tucson, AZ (US)

(73) Assignee: Arizona Board of Regents on Behalf of The University of Arizona, Tucson, AZ (US)

( * ) Notice: Subject to any disclaimer, the term of this patent is extended or adjusted under 35 U.S.C. 154(b) by 0 days.

(21) Appl. No.: 17/659,712

(22) Filed: Apr. 19, 2022

(65) Prior Publication Data
US 2022/0334207 A1    Oct. 20, 2022

Related U.S. Application Data

(60) Provisional application No. 63/176,696, filed on Apr. 19, 2021.

(51) Int. Cl.
*G01R 33/56* (2006.01)
*G06T 11/00* (2006.01)

(52) U.S. Cl.
CPC ........ *G01R 33/5608* (2013.01); *G06T 11/005* (2013.01); *G06T 11/008* (2013.01)

(58) Field of Classification Search
CPC .. G06T 11/005; G06T 11/008; G01R 33/5608
See application file for complete search history.

(56) References Cited

U.S. PATENT DOCUMENTS

| 8,244,011 B2* | 8/2012 | Fuderer ............ G01R 33/56509 382/128 |
| 11,125,847 B2* | 9/2021 | Eck ..................... G01R 33/4824 |
| 2018/0247436 A1* | 8/2018 | Korobchenko ....... G06T 11/005 |

OTHER PUBLICATIONS

Grimm, R., Forman, C., Hutt er, J., Kiefer, B., Horn egger, J., & Block, T. (2013). Fast automatic coil selection for radial stack-of-stars GRE imaging . In Proceedings of the 21st Annual Meeting of ISMRM (p. 3786).

(Continued)

*Primary Examiner* — Gregory H Curran
(74) *Attorney, Agent, or Firm* — Cozen O'Connor

(57) ABSTRACT

A method for producing a streak-suppressed MR image of a subject includes (i) generating an interference correlation matrix from M coil images, (ii) producing eigenvectors of the interference correlation matrix, and (iii) determining, from the subspace-eigenvectors, a projection matrix of the interference null space. The subspace-eigenvectors include a plurality of subspace-eigenvectors that span an interference subspace and a plurality of null-space-eigenvectors that span an interference null space. The method also includes generating, from N coil images derived from a respective one of N MR signals, N streak-suppressed multi-coil images by either (i) preprocessing the N coil images with the projection matrix and applying an image-reconstruction technique to each of the resultant N preprocessed coil images, or (ii) applying an image-reconstruction technique to each of the N coil images to obtain N reconstructed coil images and post-processing the resultant N reconstructed coil images with the projection matrix.

15 Claims, 11 Drawing Sheets

(56) References Cited

OTHER PUBLICATIONS

Mandava, 5., Keerthivasan, M. B., Martin, D. R., Altbach, M. I., & Bilgin, A. (2019). Radial streak artifact reduction using phased array beamforming. Magnetic resonance in medicine, 81(6), 3915-3923.

Altbach, M . I., Bilgin, A., Li, Z., Clarkson, E. W., Trouard, T. P., & Gmitro, A. F. (2005). Processing of radial fast spin-echo data for obtaining T2 estimates from a single k-space data set. Magnetic Resonance in Medicine: An Official Journal of the International Society for Magnetic Resonance in Medicine, 54(3), 549-559.

Walsh, D. 0 ., Gmitro , A. F., & Marcellin , M. W. (2000). Adaptive reconstruction of phased array MR imagery. Magnetic Resonance in Medi cine: An Official Journal of the International Society for Magnetic Resonance in Medicine, 43(5), 682-690.

Tamir, J. I., Uecker, M., Chen, W., Lai, P., Alley, M. T., Vasanawala, 5. 5., & Lustig, M. (2017). T2 shuffling : sharp, multi contrast, volumetric fast spin-echo imaging. Magnetic resonance in medicine, 77(1), 180-195.

\* cited by examiner

| maximize SIRG when SCR > −3 dB | ACS | B-STAR | method 700 |
|---|---|---|---|
| subject in FIG. 11 (single arm reference) | | | |
| SCR (dB) | −0.51 | −0.58 | −0.49 |
| ICR (dB) | −17.99 | −26.96 | −33.92 |
| SIEG (dB) | 17.48 | 26.38 | 33.43 |
| subject 1 in FIG. 12 | | | |
| SCR (dB) | −0.80 | −0.69 | −0.42 |
| ICR (dB) | −15.37 | −18.42 | −21.89 |
| SIEG (dB) | 14.57 | 17.73 | 21.41 |
| subject 2 in FIG. 12 | | | |
| SCR (dB) | −2.58 | −2.30 | −1.60 |
| ICR (dB) | −19.18 | −20.47 | −25.35 |
| SIEG (dB) | 16.60 | 18.17 | 23.75 |

FIG. 13

MRI STREAK-ARTIFACT SUPPRESSION, SYSTEM AND METHOD

CROSS-REFERENCE TO RELATED APPLICATIONS

This application claims the benefit of U.S. Provisional Application No. 63/176,696, filed on Apr. 19, 2021, the disclosure of which is incorporated herein by reference in its entirety.

GOVERNMENT RIGHTS

This invention was made with government support under Grant No. R01 CA 245920 awarded by the National Institutes of Health. The government has certain rights in the invention.

BACKGROUND

Radial k-space scanning is becoming increasingly popular for abdominal magnetic resonance imaging (MRI) due to its reduced sensitivity to motion and its potential for supporting accelerated imaging. Abdominal MRI is challenging due to its strong susceptibility to voluntary and involuntary motion. This makes radial imaging particularly attractive for abdominal applications. However, when imaging objects with a large field of view, streaking artifacts due to gradient nonlinearities corrupt images even when Nyquist sampling requirements are satisfied. In the abdomen, common sources of streaks are unsuppressed fat, such as fat present in an imaged subject's arms. For example, FIG. 1 is an abdominal MR image 160 that includes streak artifacts 162 originating in a region 164, which corresponds to a subject's right arm. Some of streak artifacts 162 extend through the subject's abdomen. MR image 160 and other MR images shown herein are inverted such that dark regions correspond to strong MR signal strength. FIG. 1 denotes selected artifact regions 165 of MR image 160 that include one or more streak artifacts 162. The cross-section of MR image 160 is parallel to a plane, hereinafter the x-y plane, formed by orthogonal axes A1 and A2, which are each orthogonal to an axis A3 that is parallel to a direction z.

Due to the narrow confines of many MRI main magnets, the arms of the person being imaged are typically positioned near the edge of the magnet where the magnetic field gradients tend to be more nonlinear than in a center of the magnet. Such non-linear gradients increase likelihood of streak artifacts.

When the level of streaking is mild, radiologists can easily read through the artifacts. Strong streaking artifacts can lead to unacceptable loss in image quality and, in some cases, can obscure pathology. Prior coil removal methods prune coil images that contribute most to streaking artifacts at the expense of signal loss.

In practice, a subset of coils in a phased array of coils of an MR scanner contributes the majority of the streaking artifacts. One strategy to mitigate these artifacts involves identifying the problematic coils and discarding the data from them prior to coil combination. Manual identification of problematic coils can be quite laborious as trading artifact reduction vs. signal-to-noise ratio (SNR) loss is non-trivial. Other strategies can lead to undesired loss of SNR when coils are pruned or down-weighted heavily to minimize artifacts.

A recent technique uses phased array beamforming to remove such streaks while preserving the signal. However, the technique is applied to coil images as a post-processing step. Therefore, it is not suitable to be used together with iterative reconstruction techniques. Since iterative reconstructions aim to reduce streaks due to undersampling, presence of streaks due to gradient nonlinearities presents additional challenges for this technique.

SUMMARY OF THE EMBODIMENTS

Embodiments disclosed herein overcome deficiencies of previous streak-suppression methods by cancelling streak artifacts using the interference null space spanned by eigenvectors of a correlation matrix. This method may be incorporated either as a preprocessing step or into iterative reconstructions.

In a first aspect, a method for producing a streak-suppressed MR image of a subject includes (i) generating an interference correlation matrix from M coil images, (ii) producing eigenvectors of the interference correlation matrix, and (iii) determining, from the plurality of subspace-eigenvectors, a projection matrix of the interference null space. Each of the M coil images was derived from a respective one of M MR signals each detected by a respective one of a phased array of M coils of an MRI scanner. The eigenvectors include a plurality of subspace-eigenvectors that span an interference subspace and a plurality of null-space-eigenvectors that span an interference null space. The method also includes generating, from N coil images derived from a respective one of N MR signals each detected by a respective one of the phased array of M coils, N streak-suppressed multi-coil images by either (i) preprocessing the N coil images with the projection matrix and applying an image-reconstruction technique to each of the resultant N preprocessed coil images, or (ii) applying an image-reconstruction technique to each of the N coil images to obtain N reconstructed coil images and post-processing the resultant N reconstructed coil images with the projection matrix.

In a second aspect, a magnetic resonance imaging system includes circuitry that executes the method of the first aspect.

BRIEF DESCRIPTION OF THE FIGURES

FIG. 13 is tabulated data showing quantitative performance of the three of FIGS. 11 and 12.

DETAILED DESCRIPTION OF THE EMBODIMENTS

Nuclear magnetic resonance occurs when nuclei having an odd number of nucleons, such as hydrogen $H^1$, are exposed simultaneously to a magnetic field sufficiently strong to align the magnetic moment of these nuclei due to spins of the nucleons, and to electromagnetic radiation at a specific magnetic-field-dependent frequency. At this specific frequency, energy may be absorbed from the electromagnetic field or energy may be re-radiated after stimulus with the electromagnetic field. The electromagnetic field is typically in the VHF to UHF radio frequency bands.

Figure 2:
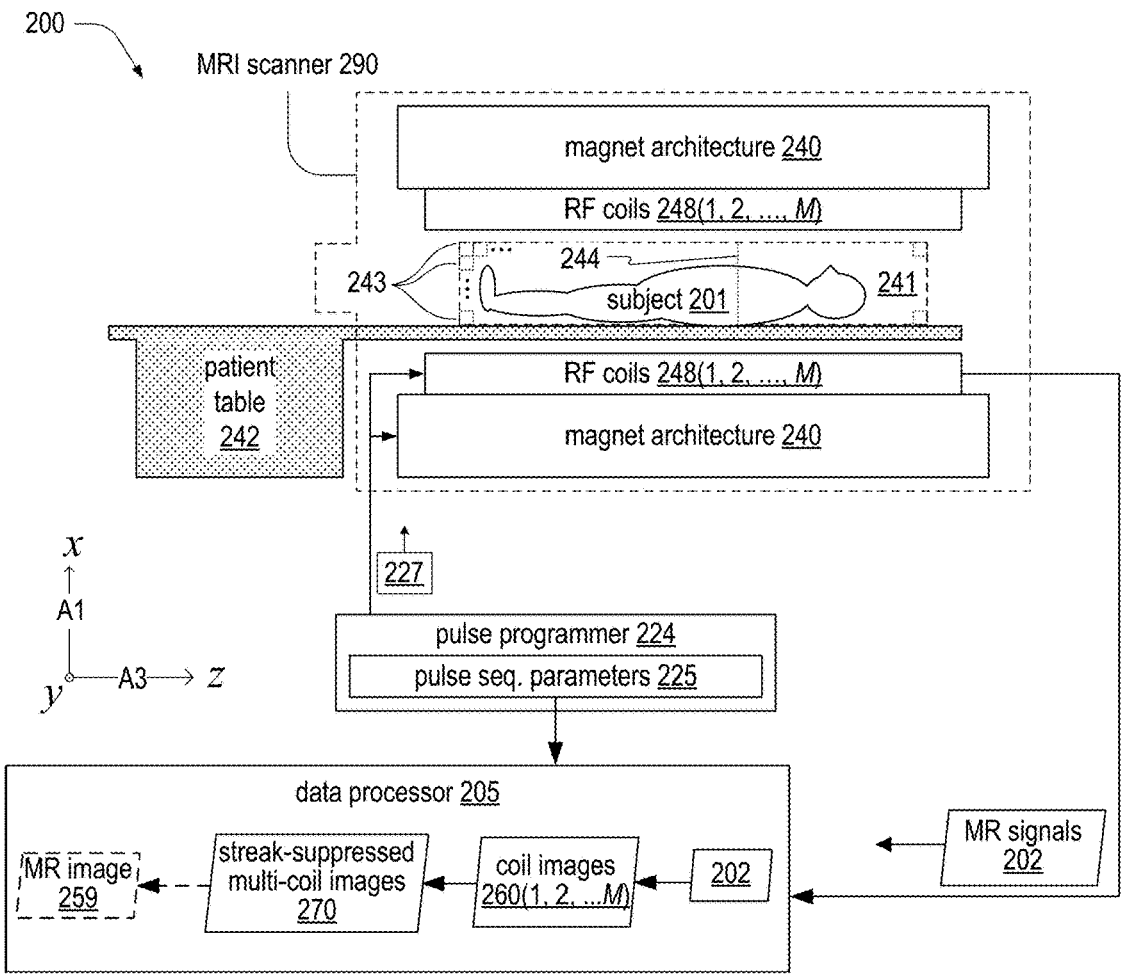
FIG. 2 is a functional block diagram of magnetic resonance imaging (MRI) system for forming an MR image of a subject, in an embodiment.

FIG. 2 is a functional block diagram of one example magnetic resonance imaging (MRI) system 200 for forming an MR image 259 of a subject 201. MRI system 200 includes an MRI scanner 290 and utilizes a pulse sequence configurable to minimize or reduce phase error in MR image 259. MRI scanner 290 includes a magnet architecture 240 and a plurality of RF coils 248 (1, . . . , M). MRI system 200 may include at least one phased array coil, each including a plurality of coils 248. In embodiments, the phased array coil includes between twenty and forty coils, each functioning as a respective channel Subject 201 lies on a patient table 242 such that at least a part of subject 201 is within an imaging volume 241 that is subdivided into a plurality of voxels 243. For clarity of illustration, not all voxels 243 of imaging volume 241 are shown in FIG. 2. RF coils 248 function as receiver channels of MR signals generated within the portion of subject 201 located within imaging volume 241.

Figure 1:
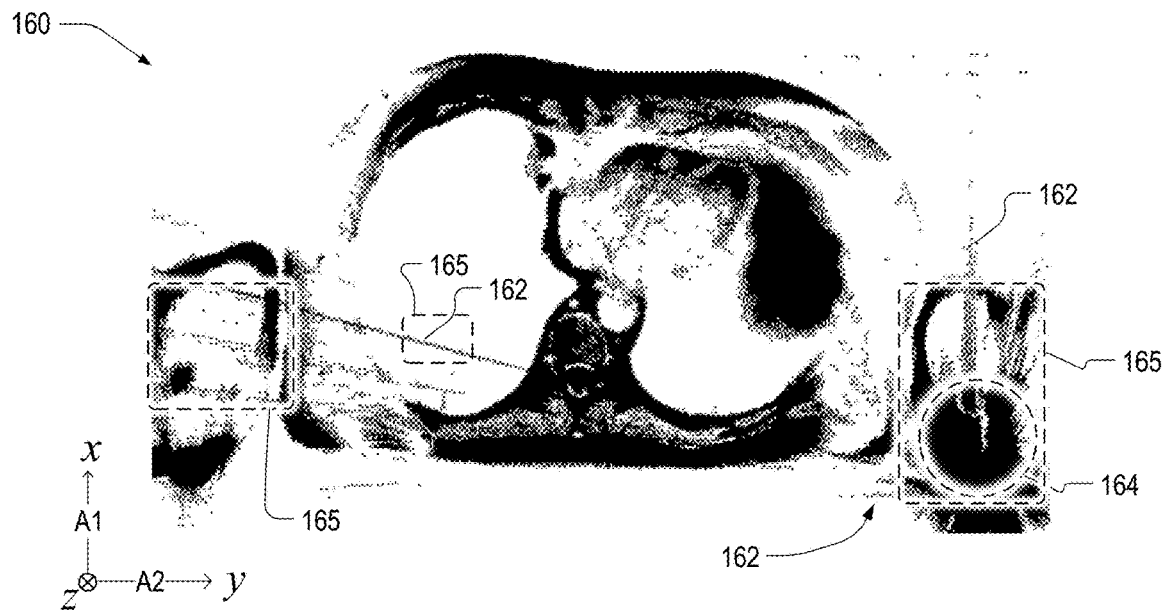
FIG. 1 is an abdominal MR image that includes streak artifacts.

Transverse and sagittal planes intersecting subject 201 are parallel to the x-y plane and the x-z plane, respectively. Imaging volume 241 includes a transverse plane 244, which is a representative plane corresponding to the plane of MR image 160, FIG. 1. Transverse plane 244 intersects a plurality of voxels 243 that include sources of streak artifacts 162. The total volume of voxels 243 equals that of imaging volume 241.

RF coils 248 may be transceivers that function as antennae capable of both (a) transmitting an RF signal to excite protons in subject 201 and (b) receiving MR signals from excited protons. In embodiments, MRI scanner 290 includes dedicated transmitter coils for transmitting RF signals, such that RF coils 248 operate as receiver coils only.

In embodiments, each RF coil 248 functions as a separate receiver channel of MRI system 200, and is accordingly and interchangeably referred to as receiver coil 248, receiver channel 248, or channel 248. Each RF coil 248 may be at least one of a surface coil, a paired saddle coil, a bird cage coil, a Helmholtz coil pair, and other coil types known in the art.

MRI system 200 also includes a data processor 205 and a pulse programmer 224. Pulse programmer 224 applies a pulse sequence 227 to RF coils 248 and magnet architecture 240. Pulse programmer 224 includes pulse sequence parameters 225 that, at least in part, define pulse sequence 227. Pulse sequence parameters 225 may be stored in memory within pulse programmer 224. Pulse programmer 224 determines an RF signal to be transmitted by RF coils 248 (or, alternatively, dedicated transmitter coils) according to pulse sequence parameters 225. RF coils 248 transmit this RF signal to imaging volume 241 so as to excite nuclear magnetic resonances of protons in subject 201. The excited protons emit MR signals that are detected by RF coils 248. RF coils 248 may include coils in orthogonal planes such that they make in-phase (real) and quadrature (imaginary) measurements of MR signals.

Pulse sequence parameters 225 relevant to controlling RF coils 248 may include repetition time between RF pulses emitted by RF coils 248. Magnet architecture 240 produces a magnetic field within volume 241. Pulse sequence parameters 225 include parameters that define gradients of this magnetic field such as echo times. Data processor 205 receives MR signals detected by RF coils 248 as MR signals 202. Data processor 205 includes software that reconstructs a plurality coil images 260 from MR signals 202. From either of coil images 260, data processor 205 generates a plurality of streak-suppressed multi-coil images 270.

Data processor may combine streak-suppressed multi-coil images to yield a streak-suppressed MR image 259. When coil images 260 are k-space images, e.g., in the spatial-frequency domain, data processor 205 inverts coil images 260, via a Fourier transform or its inverse, for example, to recover magnitude and/or phase parameters for each voxel 243. The recovered magnitude and phase voxels for each channel are then processed to yield image data 259.

Figure 3:
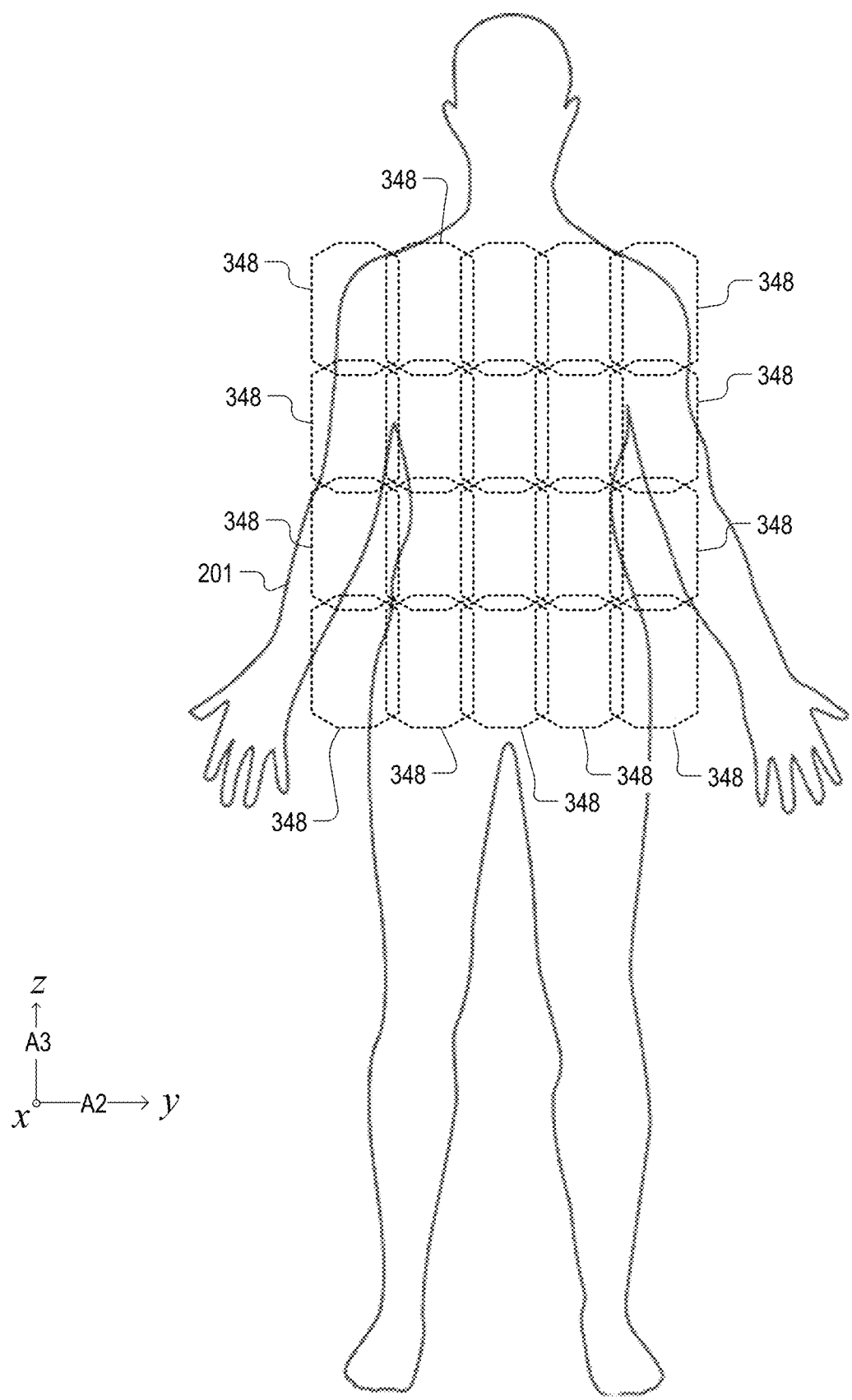
FIG. 3 is a schematic plan view the subject of FIG. 2 with a plurality of example coil positions of the MRI system of FIG. 2 superimposed thereon, in an embodiment.

FIG. 3 is a schematic plan view of subject 301 with a plurality of coil positions 348 superimposed thereon. In embodiments, each coil position 348 corresponds to a location of a respective RF coil 248. For clarity of illustration, not all coil positions 348 are enumerated in FIG. 3.

Figure 4:
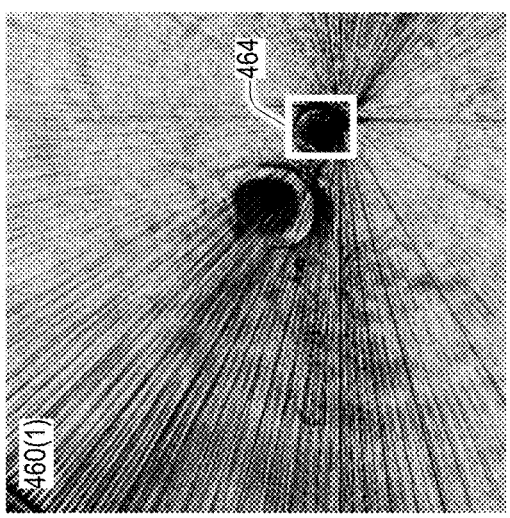
FIG. 4 illustrates examples of coil images generated by the MRI system of FIG. 2.
Figure 4:
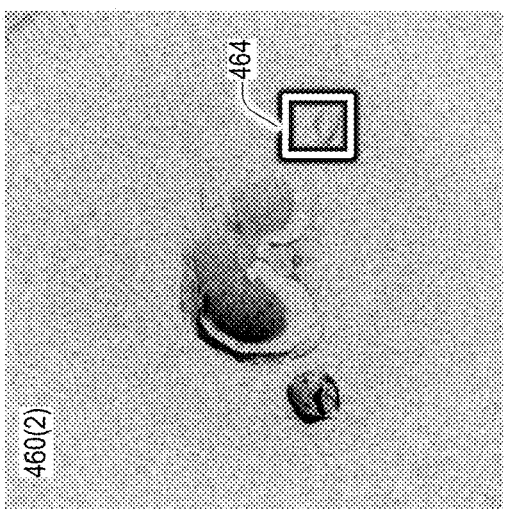
Figure 4:
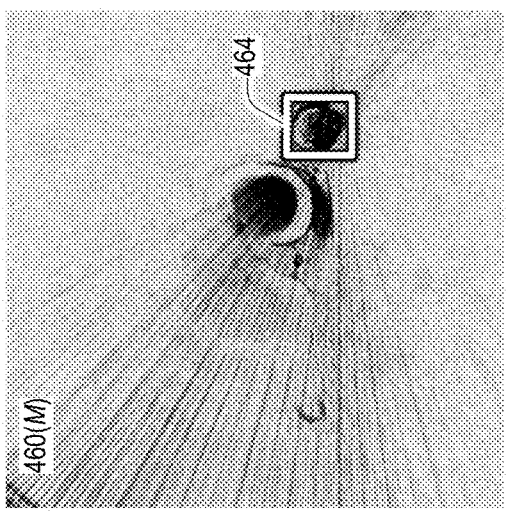
Figure 4:
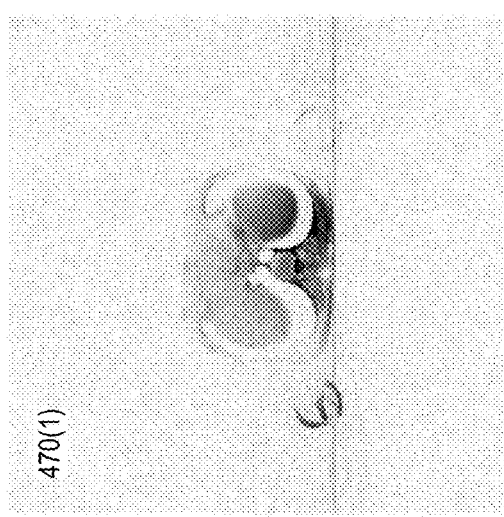
Figure 4:
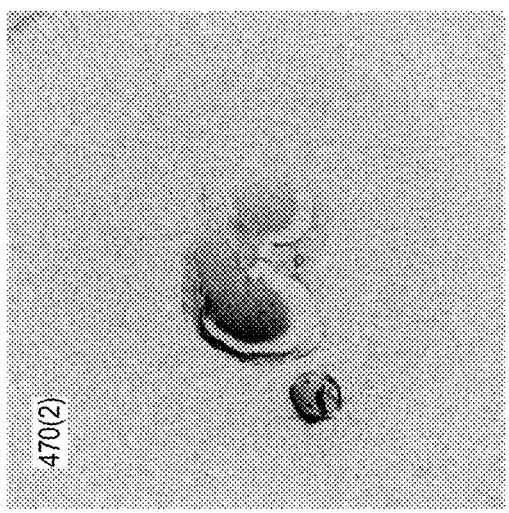
Figure 4:
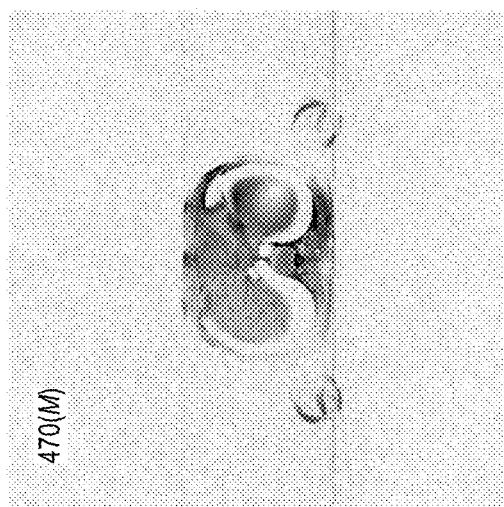

FIG. 4 illustrates coil images 460(1), 460(2), and 460(M), each of which are examples of a respective coil image 260. Coil images 460(1) and 460(M) contain strong radial streaks emanating from a region 464, which includes a cross-sectional MR image of the right arm of subject 201. FIG. 4 also illustrates streak-suppressed multi-coil images 470(1), 470(2), and 470(M) each of which are examples of a respective streak-suppressed multi-coil image 270.

In embodiments, data processor 205 generates streak-suppressed multi-coil images 470 from coil images 460 by processing coil images using equations (1)-(5) described below. Each image 470(k) may be represented by a two-dimensional single-coil matrix $X_k$, which is a $p_x \times p_y$ array. Each element of single-coil matrix $X_k$ represents image data at a respective coordinate (x,y) within a cross-sectional plane of subject 201. Index k is a positive integer less than or equal to M. Matrices $X_{k=1, 2, \ldots, M}$ may be combined to form an image stack $\overline{X}=[X_1, X_2, \ldots, X_M]$, which is a three-dimensional array with dimensions $p_x \times p_y \times M$.

Given at least one region of interest (denoted as $\Omega$) corresponding to the source(s) of the streaks, an interference correlation matrix is estimated using eq. (1). In eq. (1), |•| denotes the cardinality of a set, H denotes the conjugate transpose, and s denotes a plurality of coordinates (x,y) in the region of interest. Coordinates (x, y) correspond to a location within a cross-sectional plane of subject 201. In equations (1)-(4), uppercase bold letters denote matrices, and lowercase bold letters denote vectors.

$$C_i = \frac{1}{|\Omega|} \sum_{s \in \Omega} \overline{X}(s)\overline{X}(s)^H \qquad (1)$$

$$C_i = QDQ^H \qquad (2)$$

$$Q = [e_1, e_2, \ldots, e_\gamma \mid e_{r+1}, \ldots, e_N] = [Q_r \mid Q_{N-r}] \qquad (3)$$

$$P = I - Q_r Q_r^H \qquad (4)$$

$$d_\perp = Pd \qquad (5)$$

An eigenanalysis of matrix $C_i$ via eq. (2) yields eigenvectors e that span the space comprising two orthogonal subspaces: an interference subspace $Q_r$ and an interference null space $Q_{N-r}$ shown in eq. (3). Matrix Q is a modal matrix of subspace-eigenvectors e. The first r eigenvectors span the interference subspace and the remaining (N–r) eigenvectors span the interference null space. $Q_r^H$ is the Hermitian transpose of $Q_r$. D is a diagonal matrix.

Equation (4) is an expression for a projection matrix P onto the interference null space, which may be applied either in the spatial domain or in the spatial-frequency domain (k-space). Eq. (5) shows projection matrix P operating on a vector or matrix d. In a first example, d represents a single-coil image, such coil image 260 in either the spatial domain or spatial-frequency domain. Preprocessed coil image $d_\perp$ is the projection of the coil data into the interference null space. In a second example, d includes k-space representations of each of single-coil matrices $X_{k=1, 2, \ldots, M}$. When the k-space representation of each single-coil matrix $X_k$ is a two-dimensional array with dimensions $p_{v_x} \times p_{v_y}$, then d or its transpose is a two-dimensional array with $(p_{v_x} \cdot p_{v_y})$ rows and M columns. In a third example, d includes spatial-domain representations of each single-coil matrices $X_{k=1, 2, \ldots, M}$, and d or its transpose is a two-dimensional array with $(p_x \cdot p_y)$ rows and M columns. In the aforementioned second and third examples, d may be a Casorati matrix of single-coil matrices $[X_1, X_2, \ldots, X_M]$.

Applying the projection in k-space eliminates streaks due to gradient nonlinearities from the k-space data, which may subsequently be used to generate streak-suppressed multi-coil image 270. In embodiments, streak-suppressed multi-coil image 270 is an image that minimizes, to a minimization tolerance, a difference between (i) a product of a modal matrix of subspace-eigenvectors and the streak-suppressed multi-coil image and (ii) the preprocessed coil image. For example, streak-suppressed multi-coil image 270 may be determined using iterative reconstructions expressed in eq. (6).

$$\hat{m} = \operatorname*{argmin}_m f(E, m, P, d) + \lambda R(m) \qquad (6)$$

Image $\hat{m}$ is an example of a streak-suppressed multi-coil image 270, and is the value of image-data array m that minimizes objective function $f(\bullet)$.

In eq. (6) E denotes an encoding matrix, P is the projection matrix of eq. (4), λ is a weighting parameter, and R is a regularization operator. When data processor 205 executes eq. (6), the minimizing function may be subject to a predetermined tolerance, e.g., one or more stopping criteria.

Objective function $f(\bullet)$ may be a data consistency function, i.e., one that returns a value that indicates consistency of its solution with measured data. In embodiments, the argument to objective function $f(\bullet)$ is |Em−Pd|, such that image $\hat{m}$ is the value of image-data array m that minimizes a difference Em and Pd. For example, $f(E, m, P, d)$ may be an entry-wise matrix norm. In a first example, the matrix norm may be expressed as $\|A\|_p = (\sum_{i=1}^{m}\sum_{j=1}^{n}|a_{i,j}|^p)^{1/p}$, where $p \geq 1$ and $A\sigma(Em-Pd)$ and $a_{i,j}$ is the entry of matrix A in row i and column j. When p=2 the norm is Frobenius norm. In a second example, $f(E, m, P, d)$ may be an $L_{p,q}$ norm: $\|A\|_{p,q} = (\sum_{i=1}^{m}(\sum_{j=1}^{n}|A|^{q/p})^{1/p}$, where $p \geq 1$ and $q \geq 1$. In a third example, $f(E, m, P, d)$ may equal $$\max_{1 \leq j \leq n} \sum_{i=1}^{m} |a_{ij}| \text{ or } \max_{1 \leq i \leq m} \sum_{j=1}^{n} |a_{ij}|.$$

Encoding matrix E includes a combination of a Fourier transform and coil sensitivity encoding. When MRI system 200 operates to generate multi-contrast images, encoding matrix E may also include a temporal projection.

In embodiments, processor 205 generates streak-suppressed multi-coil image 270 by performing an iterative reconstruction on k-space images d, rather than on preprocessed coil images $d_\perp$.

$$\hat{\mu} = \operatorname*{argmin}_m f(E, m, d) + \lambda R(m) \qquad (7)$$

$$\hat{\mu}_\perp = P\hat{\mu} \qquad (8)$$

Figure 5:
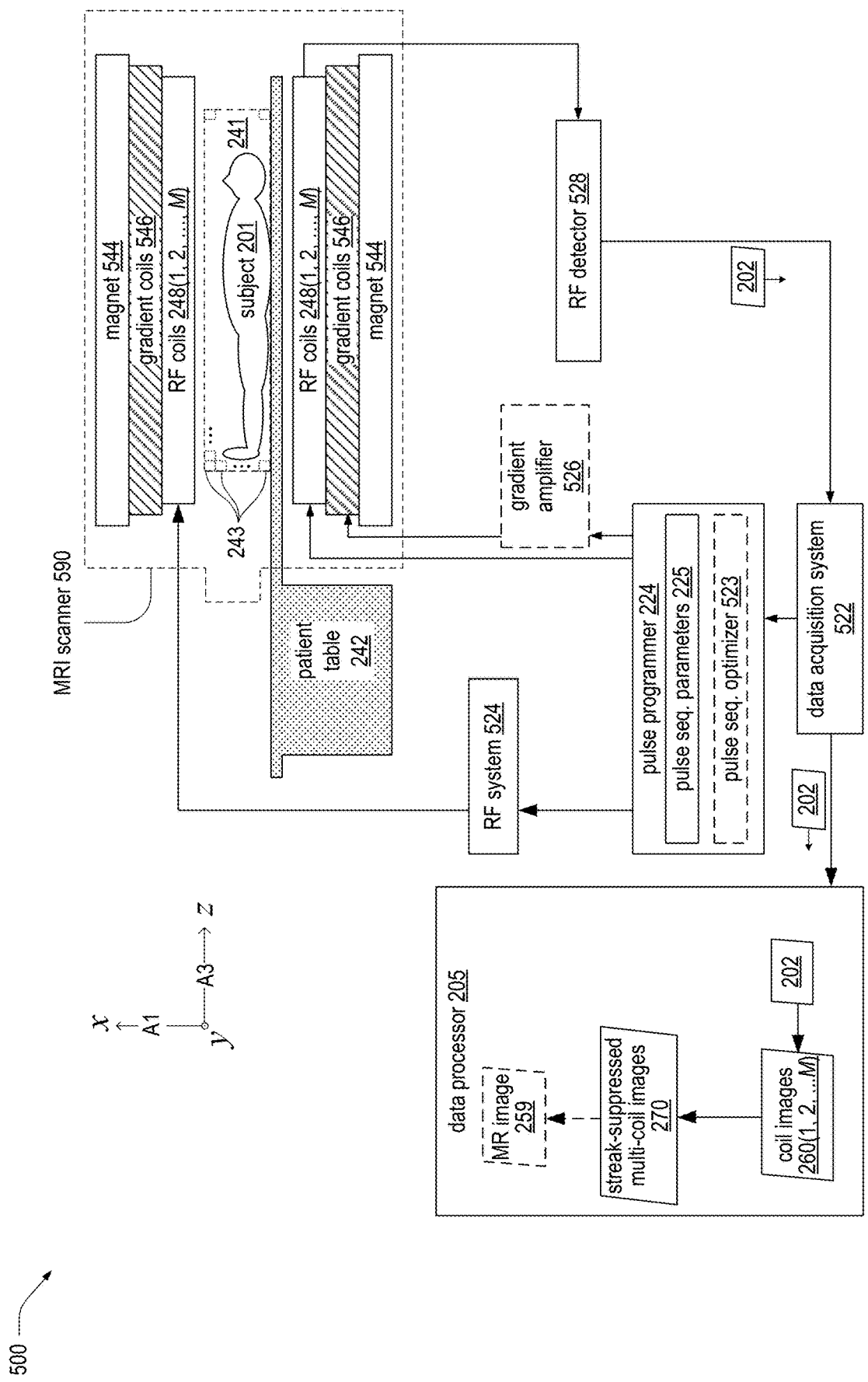
FIG. 5 is a functional block diagram of an MRI system, which is an example of the MRI system of FIG. 2.

FIG. 5 is a functional block diagram of an MRI system 500 that forms MR image 259 of subject 201. MRI system 500 is an example of MRI system 200 and includes data processor 205 and an MRI scanner 590, which is an example of MRI scanner 290, FIG. 2. MRI system 500 implements magnet architecture 240 as a magnet 544 and gradient coils 546.

In embodiments, MRI system 500 includes at least one of a data acquisition system 522, an RF system 524, and RF detector 528. MRI system 500 may further include a gradient amplifier 526. In embodiments, pulse programmer 224 includes a pulse sequence optimizer 523 for optimizing pulse sequence parameters 225 for a given type of MR measurement. RF system 524 generates RF signals for RF coils 248 according to pulse sequence parameters 225. RF system 524 may include an RF source and an RF amplifier.

In MRI scanner 590, magnet 544 produces a primary (or main) magnetic field parallel to the z-axis. Gradient coils 546 are capable of producing three orthogonal gradient fields capable of distorting the primary magnetic field in one or more directions spanned by axes x, y, and z. The gradient field is determined by pulse programmer 224, which is electrically coupled to gradient coils 546, optionally via gradient amplifier 526. Pulse programmer 224, and pulse sequence parameters 225 therein, determine the gradient fields' spatial distribution and amplitude. Pulse sequence parameters 225 relevant to controlling gradient coils 546 may include velocity-encoding gradient parameters and motion-encoding gradient parameters. Gradient amplifier 526 enables gradient coils 546 to produce sufficiently strong gradient fields to enable capture of MR images.

RF detector 528 detects MR signals received by RF coils 248 and transmits them as MR signals 202 to data processor 205 via data acquisition system 522. In some modes of operation, data acquisition system 522 may feedback at least a portion of MR signals 202 to pulse programmer 224 such that pulse programmer 224 may adjust gradient fields and transmitted RF signals in response to previous MR measurements.

Figure 6:
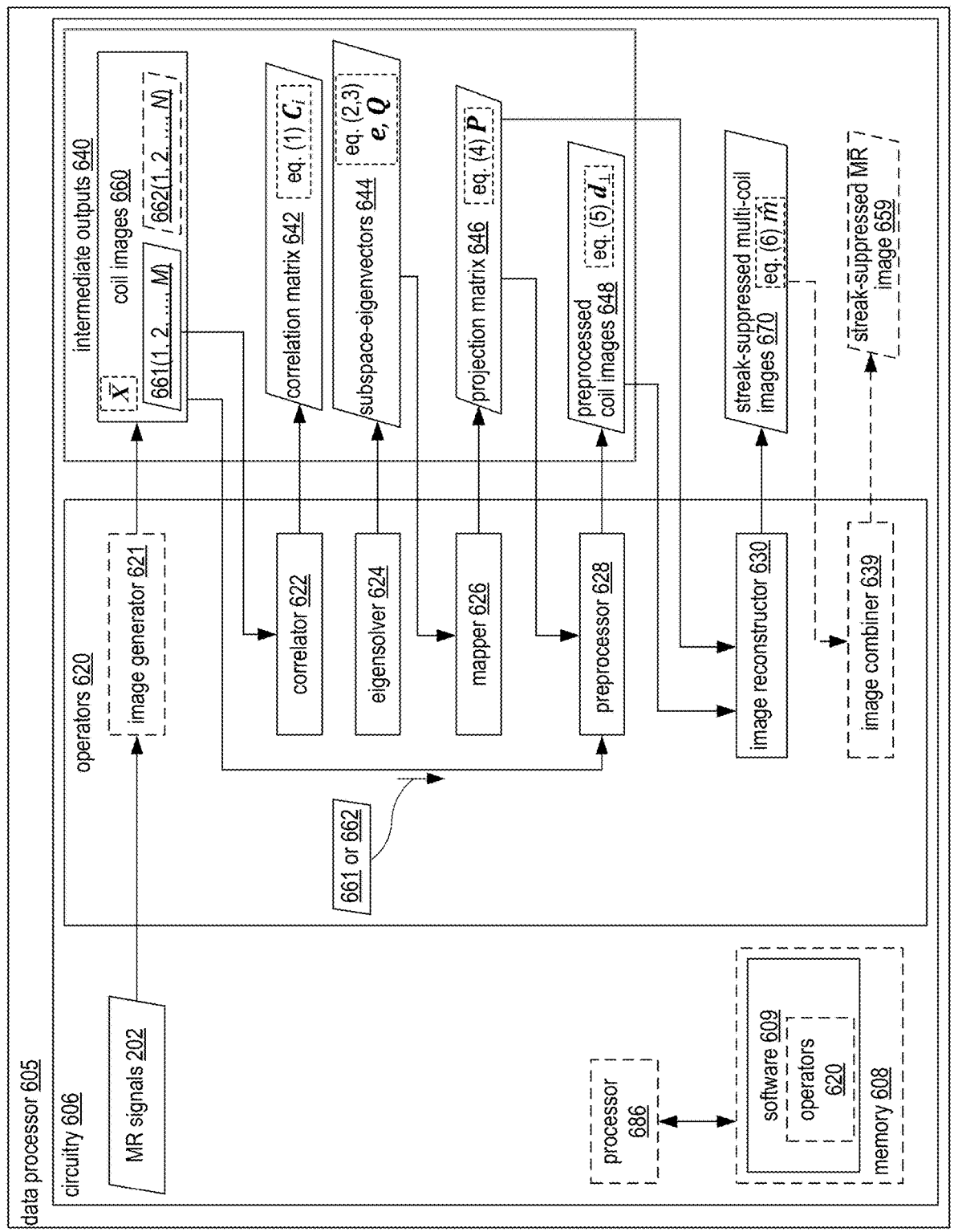
FIG. 6 is a schematic of a data processor, which is an example of a data processor the MRI system of FIG. 2.

FIG. 6 is a schematic of a data processor 605, which is an example of data processor 205 of MRI system 200, FIG. 2. Data processor 605 includes circuitry 606 that implements functionality of data processor 605. In embodiments, circuitry 606 is, or includes an integrated circuit, such as an application-specific integrated circuit or a field-programmable gate array. Circuitry 606 executes several functions of data processor 605 described herein, which are represented by operators 620. Each of operators 620 may be executed by one or more circuits of circuitry 606.

Operators 620 includes a correlator 622, an eigensolver 624, a mapper 626, a preprocessor 628, and an image reconstructor 630. Operators 620 may also include at least one of an image generator 621 and an image combiner 639. Image generator 621 generates coil images 660 from MR signals 202. Each coil image 660 is an example of a coil image 260. Coil images 660 include M coil images 661, and may also include N coil images 662, where N≤M. Coil images 661 may include at least one of coil images 662.

In embodiments, circuitry 606 includes at least one of a processor 686 and a memory 608, which stores software 609. Software 609 may include operators 620, in which case each operator 620 includes machine readable instructions that are executed by processor 686 to implement functionality of data processor 605. Software 609 may be firmware of circuitry 606.

Memory 608 may be transitory and/or non-transitory and may include one or both of volatile memory (e.g., SRAM, DRAM, computational RAM, other volatile memory, or any combination thereof) and non-volatile memory (e.g., FLASH, ROM, magnetic media, optical media, other non-volatile memory, or any combination thereof). Part or all of memory 608 may be integrated into processor 686.

Data processor 605 generates streak-suppressed multi-coil images 670 from MR signals 202. Each streak-suppressed multi-coil image 670 is an example of a respective streak-suppressed multi-coil image 270. To generate images 670 from signals 202, at least one operator 620 generates a respective intermediate output 640 that is used by a subsequent operator 620. Intermediate outputs 640 include correlation matrix 642, subspace eigenvectors 644, projection matrix 646, and preprocessed coil images 648, which are generated by correlator 622, eigensolver 624, mapper 626, and preprocessor 628 respectively. When operating, circuitry 606 stores at least one of intermediate outputs 640.

In embodiments, at least one of:
(a) image generator 621 generates a respective coil image 660 from each MR signal 202;
(b) correlator 622 executes eq. (1) to generate correlation matrix $C_i$, which is an example of correlation matrix 642;
(c) eigensolver 624 executes eq. (2) to yield eigenvectors e of equation (3), which are examples of subspace eigenvectors 644;
(d) mapper 626 executes eq. (4) to generate projection matrix P, which is an example of projection matrix 646;
(e) preprocessor 628 multiplies coil image x by projection matrix P per eq. (5) to yield preprocessed coil image $x_\perp$, which is an example of a preprocessed coil image 648. and
(f) image reconstructor 630 executes eq. (6) for each coil image 661 or 662 to generate a respective image $\hat{m}$, which is an example of streak-suppressed multi-coil image 670.

Figure 7:
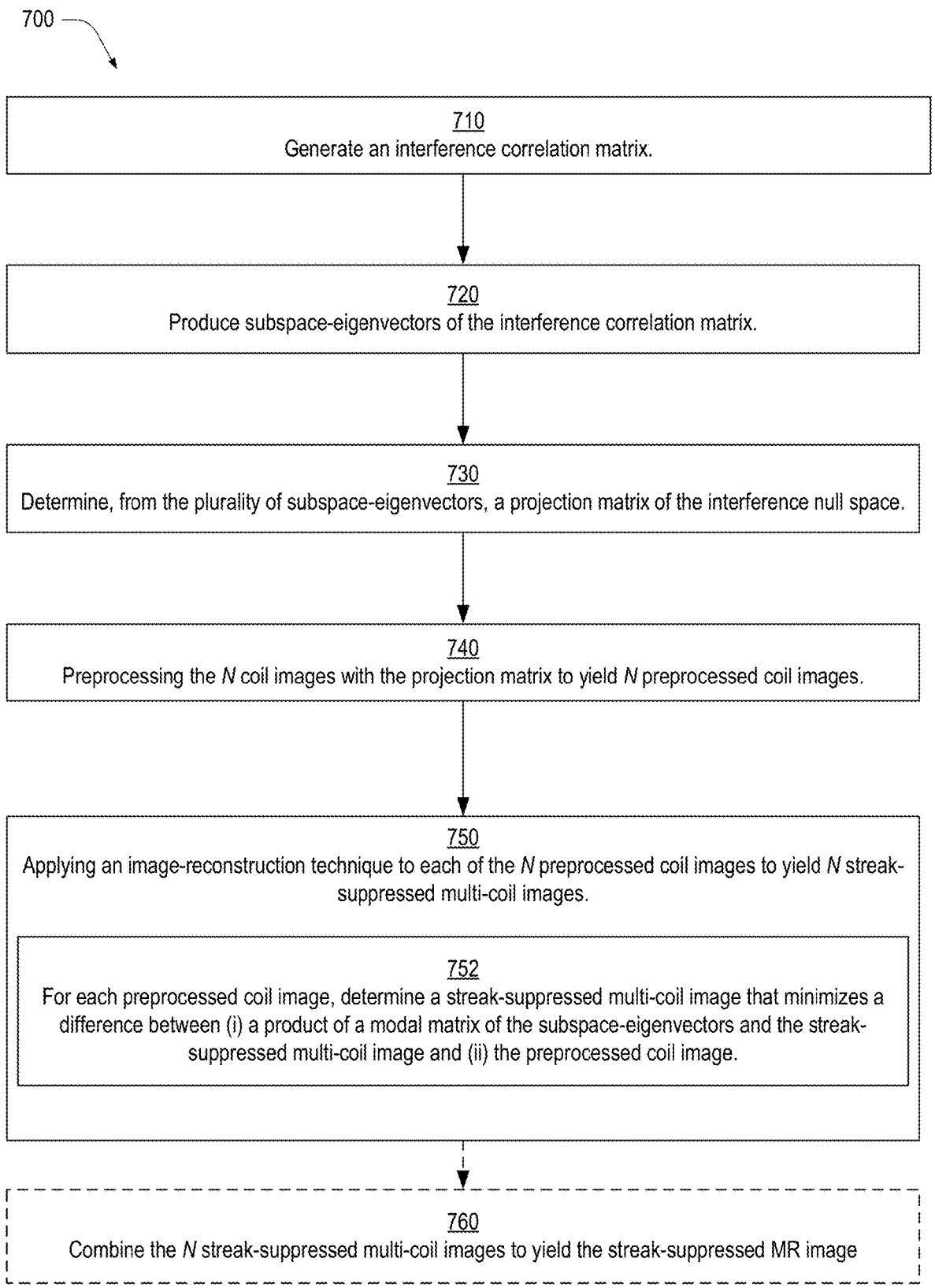
FIG. 7 is a flowchart illustrating a first method for producing a streak-suppressed magnetic resonance image of a subject, in an embodiment.

FIG. 7 is a flowchart illustrating a method 700 for producing a streak-suppressed magnetic resonance image of a subject. Method 700 may be implemented within one or more aspects of data processor 605, FIG. 6. In embodiments, method 700 is implemented by processor 686 executing computer-readable instructions of software 609. At one or more instances during the execution of method 700, at least one of each intermediate outputs 640 is stored in a memory of circuitry 606, such a memory 608. Method 700 includes steps 710, 720, 730, 740, and 750.

Step 710 includes generating an interference correlation matrix from M coil images, each of the M coil images having been derived, e.g., reconstructed, from a respective one of M MR signals each detected by a respective one of a phased array of M coils of an MRI scanner. In embodiments, the MR signals originate in a first plurality of voxels of the subject corresponding to an artifact-region of a coil image corrupted by an artifact. In an example of step 710, correlator 622 generates correlation matrix 642 from coil images 661.

Step 720 includes producing eigenvectors of the interference correlation matrix. The eigenvectors include a plurality of subspace-eigenvectors that span an interference subspace and a plurality of null-space-eigenvectors that span an interference null space. In an example of step 720, eigensolver 624 generates subspace eigenvectors 644 from correlation matrix 642.

Step 730 includes determining, from the plurality of subspace-eigenvectors, a projection matrix of the interference null space. In an example of step 730, mapper 626 determines projection matrix 646 from subspace-eigenvectors 644.

Step 740 includes preprocessing N coil images with the projection matrix to yield N preprocessed coil images. The quantity N is less than or equal to M of step 710. Each of the N coil images is derived from a respective one of N MR signals each detected by a respective one of the phased array of M coils.

In a first example of step 740, preprocessor 628 pre-processes coil images 661 with projection matrix 646 to yield preprocessed coil images 648. In this example, coil images 660 need not include coil images 662, and the M MR signals and the M coil images of step 710 include the N MR signals and N coil images, respectively.

In a second example of step 740, coil images 660 include coil images 662, and preprocessor 628 pre-processes coil images 662 with projection matrix 646 to yield preprocessed coil images 648. In this example, the M MR signals and the M coil images of step 710 do not include the N MR signals and N coil images, respectively. For example, the M coil images of step 710 used to compute the interference correlation matrix may be from a previously acquired data set, and hence are not derived from the M MR signals referred to in step 740. Several MRI datasets of the same subject may be acquired in sequence, for example. In embodiments, the M coil images may be a result of session, a "calibration scan," which is performed to estimate coil sensitivities. The M coil images, and equivalently i(s) of eq. (1), may be derived from these previous scans, such as a calibration scan.

Step 750 includes applying an image-reconstruction technique to the preprocessed coil images to obtain N reconstructed coil images. In an example of step 750, image reconstructor 630 applies an image-reconstruction technique to preprocessed coil images 648 to yield streak-suppressed multi-coil images 670.

In embodiments, step 750 includes step 752. Step 752 includes, for each preprocessed coil image, determining a streak-suppressed multi-coil image that minimizes, to a minimization tolerance, a difference between (i) a product of a modal matrix of subspace-eigenvectors and the streak-suppressed multi-coil image and (ii) the preprocessed coil image. In example of step 752, image reconstructor 630 determines, from each preprocessed MR image 648, a respective streak-suppressed multi-coil image 670 by implementing eq. (6).

Method 700 may also include a step 760, which includes combining the N streak-suppressed multi-coil images to yield the streak-suppressed MR image. In example of step 760, image combiner 639 combines streak-suppressed multi-coil images 670 to yield a streak-suppressed MR image 659.

Figure 8:
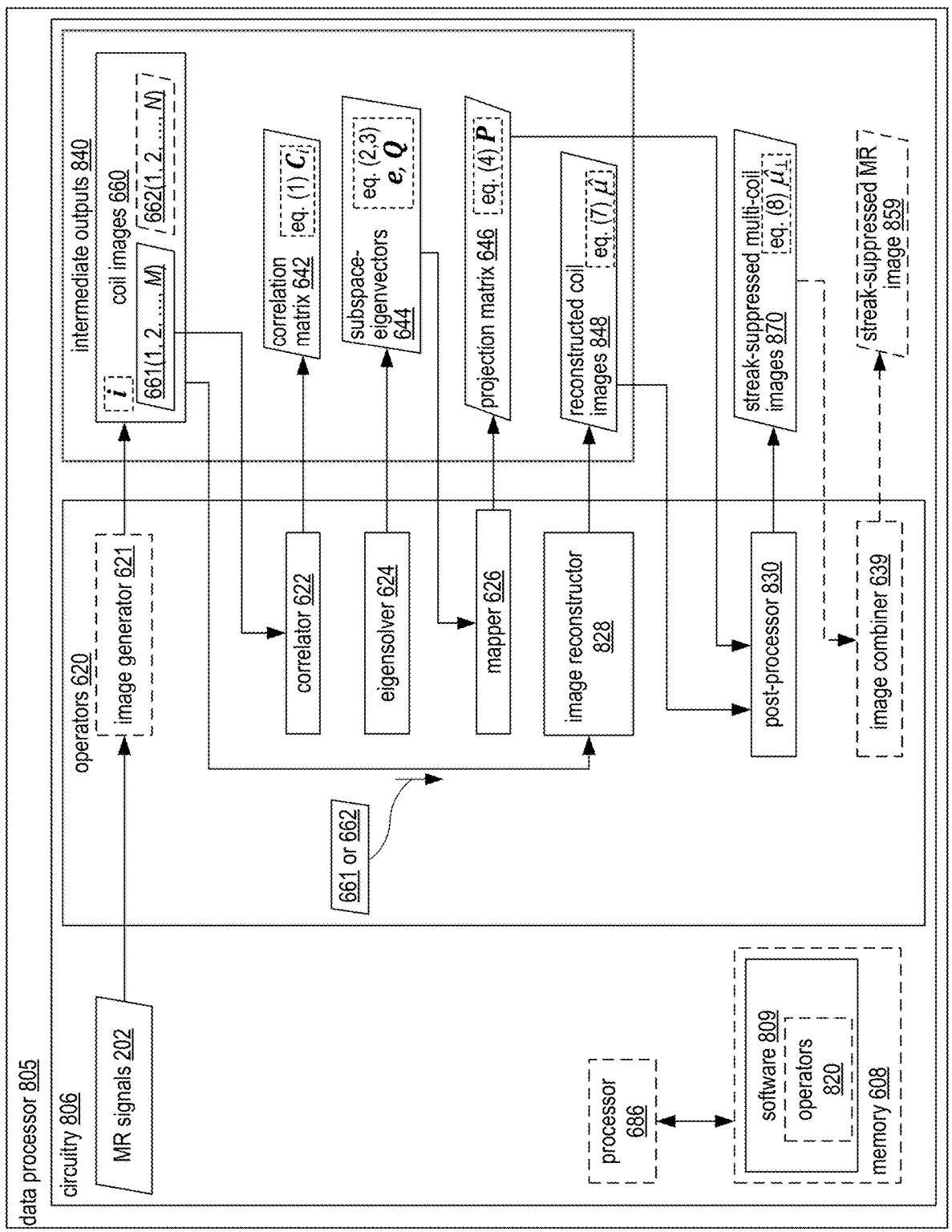
FIG. 8 is a schematic of a data processor, which is an example of a data processor of the MRI system of FIG. 2.

FIG. 8 is a schematic of a data processor 805, which is an example of data processor 205 of MRI system 200, FIG. 2. Data processor 805 includes circuitry 806 that implements functionality of data processor 605. In embodiments, circuitry 806 is, or includes an integrated circuit, such as an application-specific integrated circuit or a field-programmable gate array. Circuitry 806 executes several functions of data processor 805 described herein, which are represented by operations 820. Each of operators 820 may be executed by one or more circuits of circuitry 806.

Operators 820 includes correlator 622, eigensolver 624, and mapper 626, introduced above in the description of data processor 605. Operators 820 also include an image reconstructor 828, and a post-processor 830. Operators 820 may also include at least one of image generator 621 and image combiner 639.

In embodiments, circuitry 806 includes at least one of processor 686 and memory 608, which stores software 809. Software 809 may include operators 820, in which case each operator 820 includes machine readable instructions that are executed by processor 686 to implement functionality of data processor 805. Software 809 may be firmware of circuitry 806.

Data processor 805 generates streak-suppressed multi-coil images 870 from MR signals 202. Each streak-suppressed multi-coil image 870 is an example of a respective streak-suppressed multi-coil image 270. To generate images 870 from signals 202, at least one operator 820 generates a respective intermediate output 840 that is used by a subsequent operator 820. When operating, circuitry 806 stores at least one of intermediate outputs 840. Intermediate outputs 840 include correlation matrix 642, subspace eigenvectors 644, projection matrix 646, and reconstructed coil images 848.

Image reconstructor 828 generates reconstructed coil images 848. In embodiments, and for each coil image 661 or 662, image reconstructor 828 executes eq. (7) to generate a respective image û, which is an example of reconstructed coil image 848. From each reconstructed coil image 848, post-processor 830 generates a respective streak-suppressed reconstructed multi-coil image 870. In embodiments, and for each reconstructed coil image 848 post-processor 830 executes eq. (8) to generate a respective streak-suppressed reconstructed multi-coil image $\hat{\mu}_\perp$, which is an example of streak-suppressed reconstructed multi-coil image 870.

Figure 9:
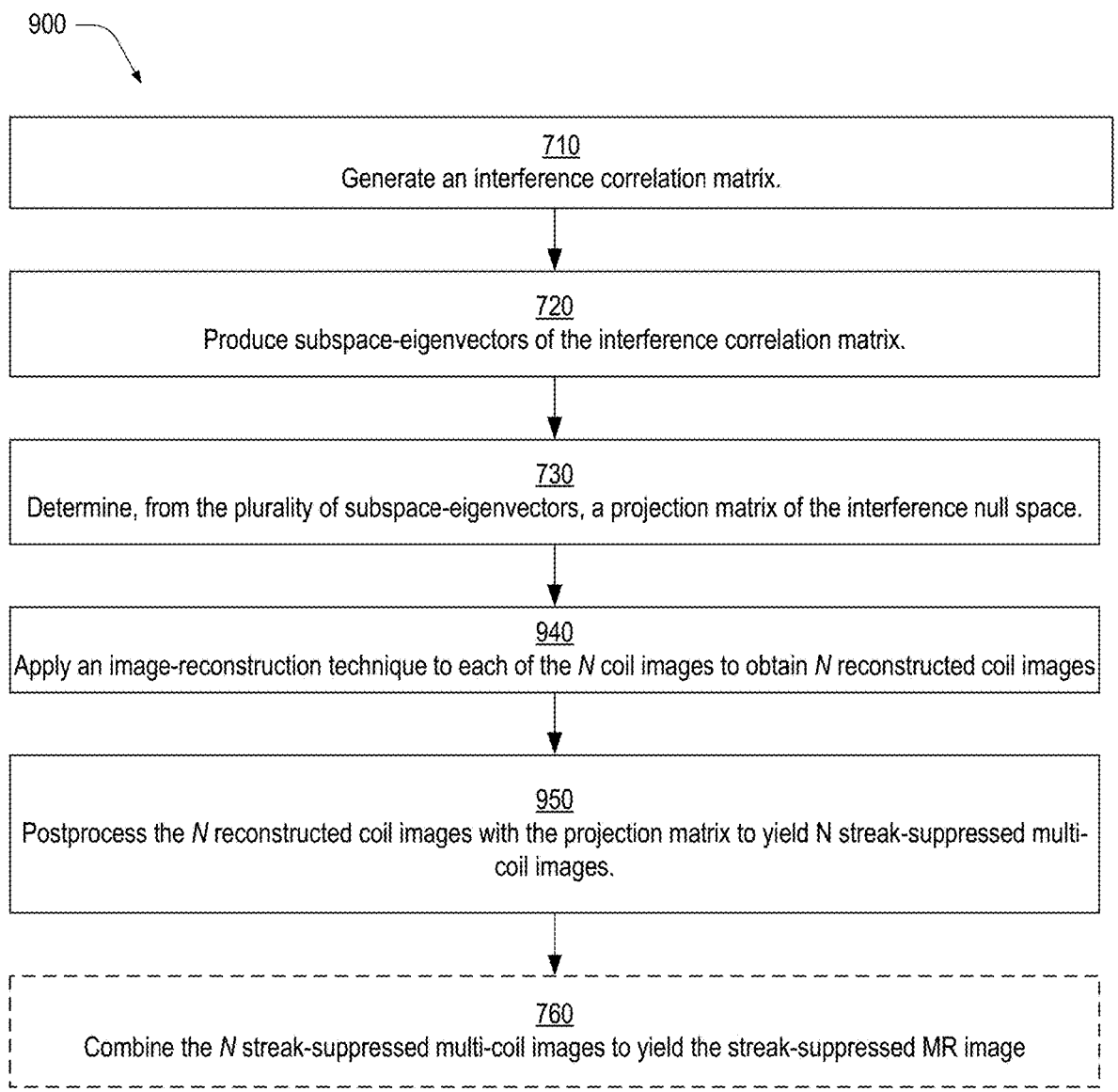
FIG. 9 is a flowchart illustrating a second method for producing a streak-suppressed magnetic resonance image of a subject, in an embodiment.

FIG. 9 is a flowchart illustrating a method 900 for producing a streak-suppressed magnetic resonance image of a subject. Method 900 may be implemented within one or more aspects of data processor 805, FIG. 8. In embodiments, method 900 is implemented by processor 686 executing computer-readable instructions of software 809. At one or more instances during the execution of method 700, at least one of each intermediate outputs 840 is stored in a memory of circuitry 806, such as a memory 608. Method 900 includes steps 710, 720, and 730 of method 700 described above. Method 900 also includes steps 940 and 950.

Step 940 includes applying an image-reconstruction technique to the N coil images to yield N multi-coil complex images. In an example of step 940, image reconstructor 828 applies an image-reconstruction technique to coil images 661 or 662 to yield reconstructed coil images 848. In this example, image reconstructor 828 may employ eq. (7) as described above.

Step 950 includes post-processing the N multi-coil complex images with the projection matrix to yield the N streak-suppressed multi-coil images. In an example of step 950, post-processor 830 processes reconstructed coil images 848 to yield streak-suppressed multi-coil images 870. In this example, post-processor 830 may employ eq. (8) as described above.

Method 700 may also include step 760 introduced in the description of method 700. In example of step 760, image combiner 639 combines streak-suppressed multi-coil images 870 to yield a streak-suppressed MR image 859.

EXAMPLES

Embodiments disclosed herein were evaluated using abdomen data acquired at 1.5T (Siemens, Aera) using a radial turbo spin echo pulse sequence (RADTSE, as in ref[3]) with TR=2500 ms, FA=150 deg, 192 views with 256 readout points/view, ETL=32 (to yield six views/TE), echo spacing=7.3 ms, slice thickness=8 mm, and FOV=40-46 cm. Streak removal was evaluated on (i) the composite images (where all radial views are used to reconstruct an image with an average TE contrast) using adaptive coil combine (ACC, ref. [4]) and on (ii) the T2 maps reconstructed from TE data sets using a model based CS approach (LLR, ref. [5]). For comparison, streak removal was also evaluated using auto coil selection (ACS) and B-STAR algorithms, refs. [1] and [2]. Quantitative metrics based on cancellation ratio (as in ref. [6]) as defined in eqs. (9)-(11) were used to compute the signal and streak cancellations.

Eqs. (9)-(11) define a signal cancellation ratio (SCR), Interference Cancellation Ratio (ICR), and Signal to Noise Ratio Gain (SIRG) respectively.

$$SCR = 10 \times \log_{10}(w^H R_s w / w^H R_{s'} w) \tag{9}$$

$$ICR = 10 \times \log_{10}(w^H R_i w / w^H R_{i'} w) \tag{10}$$

$$SIRG = SCR - ICR \tag{11}$$

In the above equations, $$w = \frac{1}{n}[1, 1, \ldots, 1]^T$$

is the quiescent weight vector, $R_s$ and $R_{s'}$ are the signal correlation matrices before and after destreaking, and $R_i$ and $R_{i'}$ are the interference correlation matrices before and after destreaking. The signal correlation matrix was estimated using a central rectangle region of interest that excludes all interference sources. The interference correlation matrix was estimated using all the interference source regions of interest.

Figure 10:
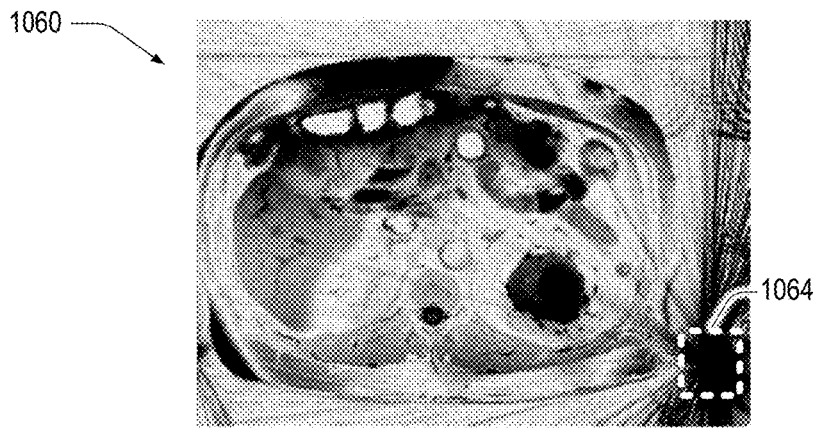
FIG. 10 shows an example of a composite image with strong streaks artifacts.
Figure 11:
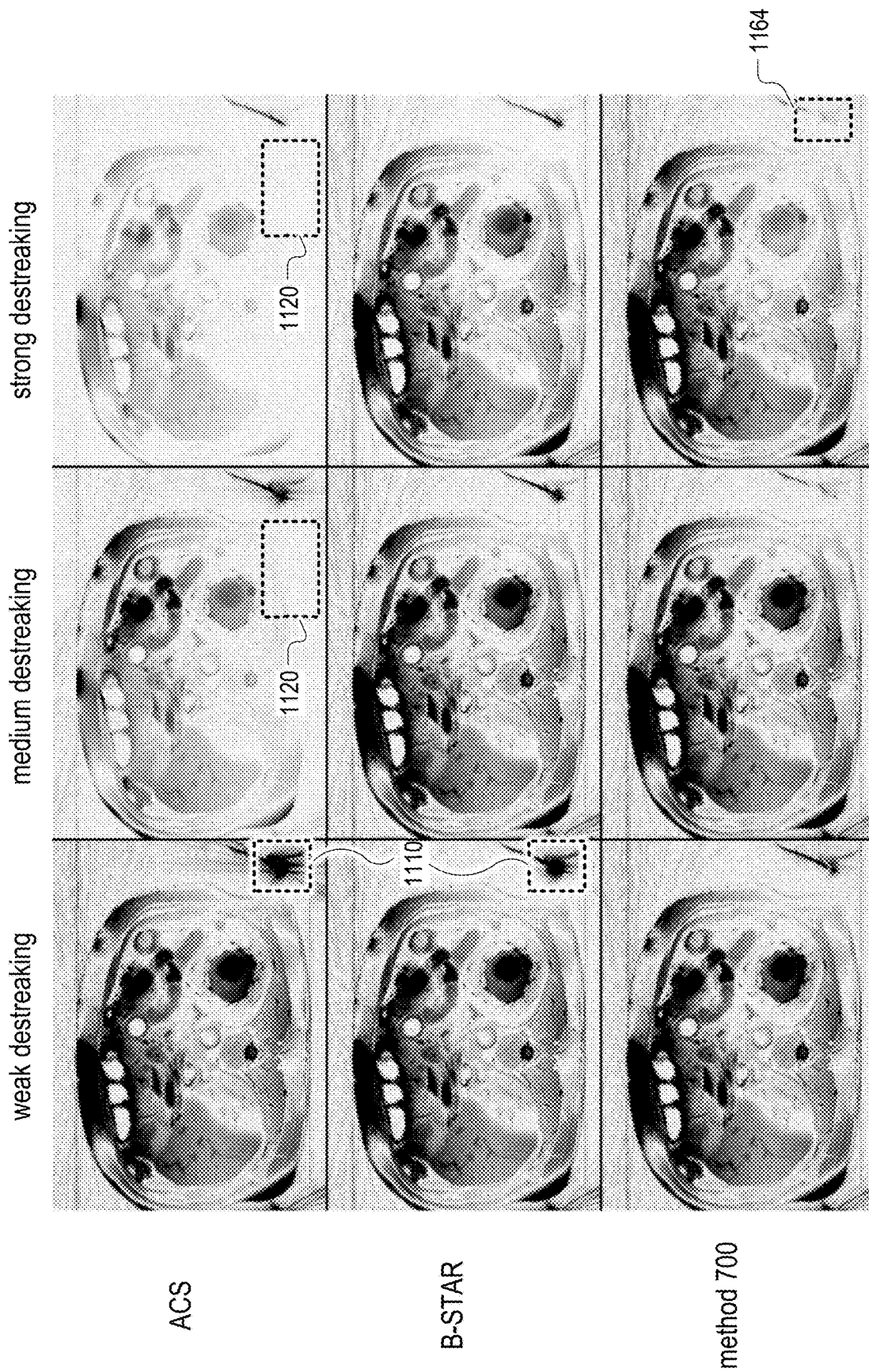
FIG. 11 shows three versions of the image of FIG. 10 after application of respective streak removal using three streak-removal methods thereto.

FIG. 10 shows an example of a composite image 1060 with strong streaks emanating from a region 1064 which includes an image of the subject's left arm. FIG. 11 shows image 1060 after application of streak removal using known methods (ACS, B-STAR), and method 700 at different levels of destreaking. The strength of destreaking was tuned via different number of pruning rounds (ACS), diagonal loading weights λ (B-STAR), and the rank of interference subspace (CACTUS). ACS and B-STAR images include residual streaking at region 1110. ACS images include signal loss at region 1120, and the strongly destreaked image produced by method 700 most successfully cancels the streaks in region 1064, as denoted by region 1164.

Figure 12:
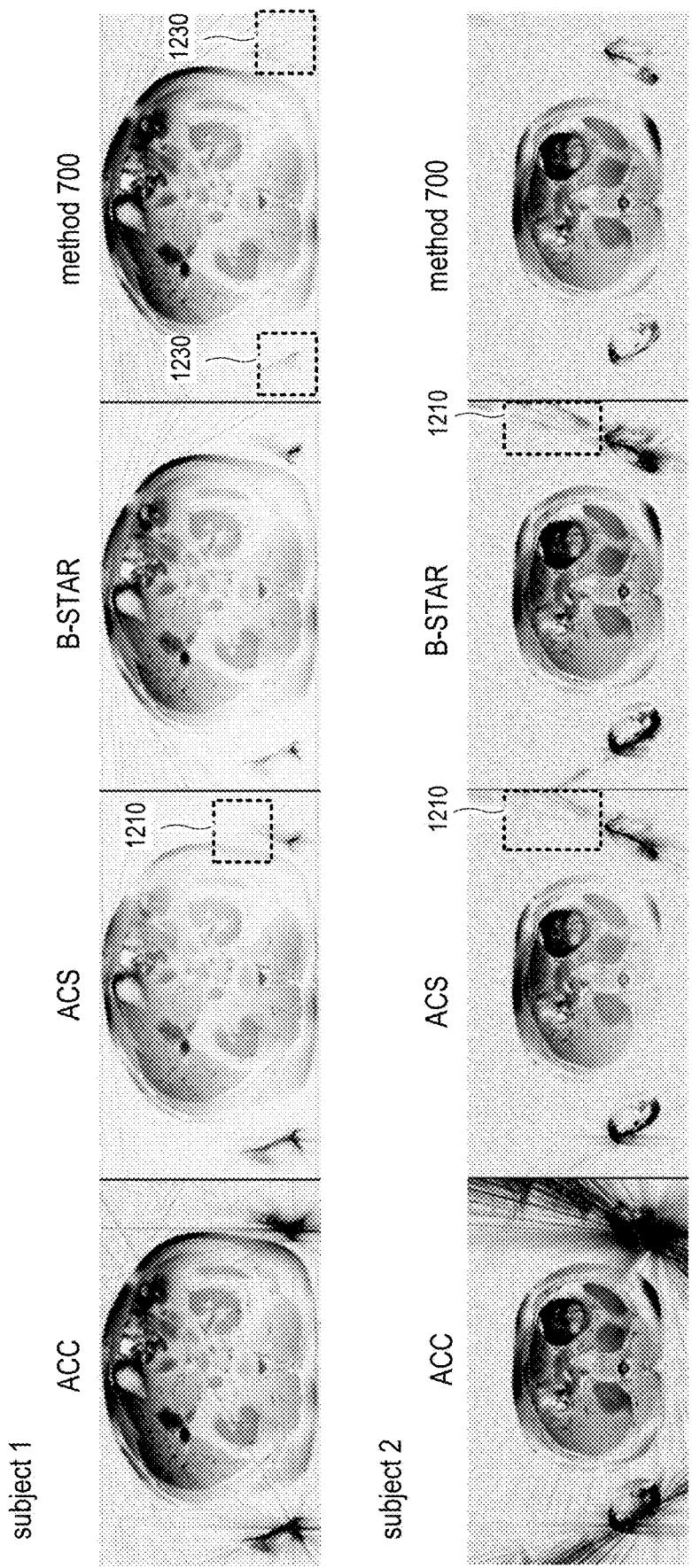
FIG. 12 shows three versions of each of a mildly-streaked MR image and a strongly-streaked MR image after destreaking via each of the using three streak-removal methods of FIG. 11.

FIG. 12 shows two cases with mild (subject 1) and strong (subject 2) streaks, which originate from multiple sources. In subject 1, ACS results in signal drop (region 1210) whereas method 700 shows excellent streak suppression at the subject's arms (regions 1230) without noticeable signal losses in the anatomy adjacent to the arms. In subject 2, the ACS and B-STAR approaches could not fully remove the streaks from the left arm (regions 1210). By contrast, method 700 reduced the streaks from both arms without significant signal loss.

FIG. 13 is tabulated data showing quantitative performance of these methods for the three cases showed in FIGS. 11 and 12. Data in FIG. 12 includes signal cancellation region (SCR), Interference Cancellation Ratio (ICR), and Signal to Noise Ratio Gain (SIRG) expressed by eqs. (9), (10), and (11) respectively.

ACS has the worst SCR, which suggesting an SNR decrease after coil removal. B-STAR preserves the signal better than ACS, but its ICR is several decibels worse than that of method 700. Method 700 also achieves the best SIRG among the three methods.

Combination of Features

Features described above as well as those claimed below may be combined in various ways without departing from the scope hereof. The following enumerated examples illustrate some possible, non-limiting combinations:

(A1) A method for producing a streak-suppressed MR image of a subject includes (i) generating an interference correlation matrix from M coil images, (ii) producing eigenvectors of the interference correlation matrix, and (iii) determining, from the plurality of subspace-eigenvectors, a projection matrix of the interference null space. Each of the M coil images were derived from a respective one of M MR signals each detected by a respective one of a phased array of M coils of an MRI scanner. The subspace-eigenvectors include a plurality of subspace-eigenvectors that span an interference subspace and a plurality of null-space-eigenvectors that span an interference null space. The method also includes generating, from N coil images derived from a respective one of N MR signals each detected by a respective one of the phased array of M coils, N streak-suppressed multi-coil images by either (i) preprocessing the N coil images with the projection matrix and applying an image-reconstruction technique to each of the resultant N preprocessed coil images, or (ii) applying an image-reconstruction technique to each of the N coil images to obtain N reconstructed coil images and post-processing the resultant N reconstructed coil images with the projection matrix.

(A2) In embodiments of method (A1), the M coil images include the N coil images.

(A3) In embodiments of method (A1), the M coil images do not include the N coil images.

(A4) In embodiments of any one of methods (A1)-(A3), generating the N streak-suppressed multi-coil images from the N coil images includes: preprocessing each of the N coil images with the projection matrix to yield a respective one of N preprocessed coil images; and applying an image-reconstruction technique to the N preprocessed coil images to yield the N streak-suppressed multi-coil images.

(A5) In embodiments of method (A4), the method includes determining a streak-suppressed multi-coil image that minimizes, to a minimization tolerance, a difference between (i) a product of a modal matrix of subspace-eigenvectors and the streak-suppressed multi-coil image and (ii) the preprocessed coil image.

(A6) In embodiments of any one of methods (A1)-(A5), generating the N streak-suppressed multi-coil images from the N coil images includes: applying an image-reconstruction technique to the N coil images to yield N multi-coil complex images, and post-processing the N multi-coil complex images with the projection matrix to yield the N streak-suppressed multi-coil images.

(A7) In embodiments of any one of methods (A1)-(A6), the projection matrix is proportional to $I-Q_r^H D Q_r$, where $I$ is an identity matrix, $Q_r$ is a matrix of a number $r$ eigenvectors that span the interference subspace, $Q_r^H$ is the Hermitian transpose of $Q_r$, and $D$ is a diagonal matrix.

(A8) Embodiments of any one of methods (A1)-(A7) further include the method includes combining the N streak-suppressed multi-coil images to yield the streak-suppressed MR image.

(A9) In embodiments of any one of methods (A1)-(A8), in said step of generating, the M MR signals originate in a first plurality of voxels of the subject corresponding to an artifact-region of a coil image corrupted by an artifact, and coordinates (x, y) correspond to a location within a cross-sectional plane of the subject.

(B1) A magnetic resonance imaging system includes circuitry that executes any one of methods (A1)-(A9).

(B2) In embodiments of system (B1), the circuitry includes one of an application-specific integrated circuit and a field-programmable gate array.

(B3) In embodiments of system (B1) the circuitry includes, a processor; and a memory storing machine readable instructions, that when executed by the processor, control the processor to execute the any one of methods (A1)-(A9).

REFERENCES

[1] Grimm, R., Forman, C., Hutter, J., Kiefer, B., Horn egger, J., & Block, T. (2013). Fast automatic coil selection for radial stack-of-stars GRE imaging. In *Proceedings of the 21st Annual Meeting of ISMRM* (p. 3786).
[2] Mandava, 5., Keerthivasan, M. B., Martin, D. R., Altbach, M. I., & Bilgin, A. (2019). Radial streak artifact reduction using phased array beamforming. *Magnetic Resonance in Medicine,* 81(6), 3915-3923.
[3] Altbach, M. I., Bilgin, A., Li, Z., Clarkson, E. W., Trouard, T. P., & Gmitro, A. F. (2005). Processing of radial fast spin-echo data for obtaining T2 estimates from a single k-space data set. *Magnetic Resonance in Medicine,* 54(3), 549-559.
[4] Walsh, D. O., Gmitro, A. F., & Marcellin, M. W. (2000). Adaptive reconstruction of phased array MR image ry. *Magnetic Resonance in Medicine,* 43(5), 682-690.
[5] Tamir, J. I., Uecker, M., Chen, W., Lai, P., Alley, M. T., Vasanawala, 5.5., & Lustig, M. (2017). T2 shuffling: sharp, multi contrast, volumetric fast spin-echo imaging. *Magnetic resonance in medicine,* 77(1), 180-195.
[6] Haimovich, A. M., & Bar-Ness, Y. (1991). An eigenanalysis interference canceler. *IEEE Transactions on signal processing,* 39(1), 76-84.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A method for producing a streak-suppressed magnetic resonance (MR) image of a subject, the method comprising:
generating an interference correlation matrix from M coil images, each of the M coil images having been derived from a respective one of M MR signals, each of the M MR signals having been detected by a respective one of a phased array of M coils of magnetic resonance imaging scanner;
producing eigenvectors of the interference correlation matrix, the eigenvectors including a plurality of subspace eigenvectors that span an interference subspace and a plurality of null-space eigenvectors that span an interference null space;
determining, from the plurality of subspace-eigenvectors, a projection matrix of the interference null space; and
generating, from N coil images derived from a respective one of N MR signals, each detected by a respective one of the phased array of M coils, N streak-suppressed multi-coil images by either (i) preprocessing the N coil images with the projection matrix and applying an image-reconstruction technique to each of the resultant N preprocessed coil images, or (ii) applying an image-reconstruction technique to each of the N coil images to obtain N reconstructed coil images and post-processing the resultant N reconstructed coil images with the projection matrix;
each of M and N being a positive integer.

2. The method of claim 1, the M coil images including the N coil images.

3. The method of claim 1, the M coil images not including the N coil images.

4. The method of claim 1, wherein generating the N streak-suppressed multi-coil images from the N coil images comprises:
preprocessing each of the N coil images with the projection matrix to yield a respective one of the N preprocessed coil images; and
applying an image-reconstruction technique to the N preprocessed coil images to yield the N streak-suppressed multi-coil images.

5. The method of claim 4, applying an image-reconstruction technique comprising, for each preprocessed coil image,
determining a streak-suppressed multi-coil image that minimizes, to a minimization tolerance, a difference between (i) a product of a modal matrix of subspace-eigenvectors and the streak-suppressed multi-coil image and (ii) the preprocessed coil image.

6. The method of claim 1, wherein generating the N streak-suppressed multi-coil images from the N coil images comprises:
applying an image-reconstruction technique to the N coil images to yield N multi-coil complex images, and
post-processing the N multi-coil complex images with the projection matrix to yield the N streak-suppressed multi-coil images.

7. The method of claim 1, the projection matrix being proportional to $I-Q_r^H D Q_r$, where I is an identity matrix, $Q_r$ is a matrix of a number r eigenvectors that span the interference subspace, $Q_r^H$ is the Hermitian transpose of $Q_r$, and D is a diagonal matrix.

8. The method of claim 1, further comprising combining the N streak-suppressed multi-coil images to yield the streak-suppressed MR image.

9. The method of claim 1, in said step of generating, the M MR signals originating in a first plurality of voxels of an imaging volume corresponding to an artifact-region of a coil image corrupted by an artifact, and coordinates (x, y) correspond to a location within a cross-sectional plane of the subject, the imaging volume including at least part of the subject.

10. A magnetic resonance imaging system comprising circuitry that executes the method of claim 4.

11. The magnetic resonance imaging system of claim 10, the circuitry including one of an application-specific integrated circuit and a field-programmable gate array.

12. A magnetic resonance imaging system of claim 10, the circuitry comprising:
a processor; and
a memory storing machine-readable instructions, that when executed by the processor, control the processor to execute the method of claim 4.

13. A magnetic resonance imaging system comprising circuitry that executes the method of claim 6.

14. The magnetic resonance imaging system of claim 13, the circuitry including one of an application-specific integrated circuit and a field-programmable gate array.

15. A magnetic resonance imaging system of claim 13, the circuitry comprising:
a processor; and
a memory storing machine-readable instructions, that when executed by the processor, control the processor to execute the method of claim 6.

* * * * *